United States Patent [19]
Lustig et al.

[11] Patent Number: 5,998,807
[45] Date of Patent: *Dec. 7, 1999

[54] INTEGRATED CMOS CIRCUIT ARRANGEMENT AND METHOD FOR THE MANUFACTURE THEREOF

[75] Inventors: Bernhard Lustig, Munich; Herbert Schaefer, Hoehenkirchen-Sieg. Brunn; Martin Franosch, Munich, all of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/925,672

[22] Filed: Sep. 9, 1997

[30] Foreign Application Priority Data

Sep. 27, 1996 [DE] Germany .................. 196 39 874

[51] Int. Cl.⁶ .................................................... H01L 29/76
[52] U.S. Cl. .............................. 257/66; 257/347
[58] Field of Search ...................... 257/66, 347

[56] References Cited

U.S. PATENT DOCUMENTS

| 5,461,250 | 10/1995 | Burghartz et al. | 257/347 |
| 5,572,046 | 11/1996 | Takemura | 257/66 |
| 5,619,057 | 4/1997 | Komatsu | 257/382 |
| 5,656,859 | 8/1997 | Murakoshi et al. | 257/750 |

FOREIGN PATENT DOCUMENTS

| 0 331 811 A2 | 9/1989 | European Pat. Off. . |
| 0 469 790 A1 | 2/1992 | European Pat. Off. . |
| 0 480 446 A2 | 4/1992 | European Pat. Off. . |
| 0 587 520 A1 | 9/1994 | European Pat. Off. . |
| 0 651 435 A2 | 5/1995 | European Pat. Off. . |
| 0 683 522 A2 | 11/1995 | European Pat. Off. . |
| 7-142742 | 6/1995 | Japan . |

OTHER PUBLICATIONS

IEEE Electron Device Letters, vol. 15, No. 3, Mar. 1994, "Electron Mobility Electron Enhancement in Strained–Si N–type Metal–Oxide–Semiconductor Field–Effect Transistors", J. Wesler et al.

IEEE IEDM Tech. Dig. S., R. Kim et al., "Enhanced Hole Mobilities in Surface–channel Strained–Si p–MOSFETs", p. 20.3.1–20.3.4.

Appl. Phys. Lett. 64, Apr. 4, 1994, "New Approach to the Growth of Low Disclocation Relaxed SiGe Material", A.R. Powell et al., p. 1856–1858.

1996 Symposium On VLSI Technology Digest of Technical Paper, Y. Mitani et al., "Buried Source and Drain (BSD) Structure for Ultra–shallow Junction Using Selective Deposition of Highly Doped Amorphous Silicon", 1996.

IBM Technical Disclosure Bulletin, "Planar Fully–Integrated Bulk/SOI SiGe CMOS Fabrication Process", vol. 34, No. 10A, Mar. 1992, pp. 128–129.

IEDM, Enhanced Hole Mobilities in Surface–channel Strained–Si p–Mosfets, R. Kim eta 1., XP–002073202, 1995.

Journal Of Vacuum Science And Technology, "The effect of substrate growth area on misfit threading disclocation densities in mismatched heterostructures", E. Fitzgerald, No. 4, Jul./Aug. 1989.

IEEE Electron Device Letters, High–Mobility GeSi PMOS on Simox, No. 11, D.K. Nayak et al., Nov. 1993.

*Primary Examiner*—Donald L. Monin, Jr.
*Assistant Examiner*—Douglas A. Wille
*Attorney, Agent, or Firm*—Hill & Simpson

[57] ABSTRACT

Semiconductor islands respectively comprise at least a $Si_{1-x}Ge_x$ layer and a distorted silicon layer that exhibits essentially the same lattice constant as the $Si_{1-x}Ge_x$ layer are formed on an insulating layer that is located on a carrier plate. The semiconductor islands are preferably formed by selective epitaxy and comprise p-channel MOS transistors and/or n-channel MOS transistors.

6 Claims, 3 Drawing Sheets

INTEGRATED CMOS CIRCUIT ARRANGEMENT AND METHOD FOR THE MANUFACTURE THEREOF

BACKGROUND OF THE INVENTION

1. Field of the Invention

The present invention relates generally to the field of semiconductor devices and, more particularly, the present invention relates to an improved CMOS circuit.

Due to the structural miniaturizations in MOS technology, the properties of MOS transistors and CMOS circuits must be maintained through the micrometer range. However, in MOS transistors with channel lengths of, for example, less than 100 nm, short-channel and punch effects occur. These effects can in fact be partially compensated by an increased doping of the substrate, but the required high doping of the substrate results in, among other things, a deterioration of the charge carrier mobility in the channel. Additionally, in MOS transistors with channel lengths less than 100 nm, the subthreshold slope d $\ln(I_{drain})$/d $V_{gate}$ must be maximized so that, even at low operating voltages, the currents in the conductive condition and in the non-conductive condition can be clearly distinguished. Finally, in order to avoid extreme short-channel effects, flat source/drain regions must be utilized that exhibit a low specific series resistance on the order of 100 $\Omega\mu$m.

2. Description of the Related Art

For increasing the charge carrier mobility, it has been proposed in the literature (see, for example, K. Rim et al., IEEE IEDM Tech. Dig., page 517 (1995) to realize n-channel and p-channel transistors in substrates that comprise strained silicon at least in the channel region of the transistors. Strained silicon is silicon whose lattice constant is increased in two spatial directions compared to unstrained silicon. Strained silicon is produced by growing silicon lattice-matched to a substrate having a higher lattice constant. $Si_{1-x}Ge_x$ is suitable as such a substrate material. The high defect densities in the $Si_{1-x}Ge_x$ substrate is a problem in the manufacture of strained silicon.

It has been proposed (see A. R. Powell et al., Appl. Phys. Lett. 64, page 1856 (1994)) to grow the $Si_{1-x}Ge_x$ layer on the thinned silicon layer of an SOI substrate. Stresses in the $Si_{1-x}Ge_x$ layer relax in this case into the thinned silicon layer lying therebelow, insofar as the germanium content in the $Si_{1-x}Ge_x$ layer is less than 15 percent.

In order to manufacture very flat source/drain regions with low series resistance, Y. Mitani et al., IEEE VLSI Tech. Dig., page 91 (1996), has proposed that the source/drain regions be manufactured by etching depressions into the surface of the substrate and selective, in situ doped growth of amorphous silicon and subsequent recrystallization of the amorphous silicon. However, there are shortcomings to this design as well.

The present invention is based on the problem of providing an integrated CMOS circuit arrangement and a method for the manufacture thereof in which short-channel effects and punch effects are prevented and high charge carrier mobility is assured.

SUMMARY OF THE INVENTION

In the CMOS circuit of the present invention, the transistors are arranged in semiconductor islands that are formed on an insulating layer. Each of the semiconductor islands comprises a $Si_{1-x}Ge_x$ layer and a strained silicon layer formed thereon. The $Si_{1-x}Ge_x$ layer can be separated from the insulating layer by a silicon layer. The strained silicon layer exhibits substantially the same lattice constant as the $Si_{1-x}Ge_x$ layer. In every semiconductor island, mechanical stresses of the $Si_{1-x}Ge_x$ layer can relax as warranted via the silicon layer formed therebelow or through, for example, the thermally softened insulation material to the sides of the semiconductor islands. The $Si_{1-x}Ge_x$ layer therefore exhibits practically no defects even with germanium content above 40 percent. The use of $Si_{1-x}Ge_x$ layers with germanium content above, for example, 15 percent, has the advantage that significantly higher electron and hole mobilities are maintained in the silicon layer distorted thereon.

Given a germanium content of, for example, 40 percent, the thickness of the silicon layer can be for example, to 10 nm. The thickness of the $Si_{1-x}Ge_x$ layer can be 20 nm and that of the strained silicon layer can be 10 nm. It is within the scope of the invention to manufacture the silicon layer in the thickness range between 0 nm and approximately 20 nm, the $Si_{1-x}Ge_x$ layer in the thickness range between 10 nm and 50 nm and with germanium contentss of 20 percent through 50 percent and the strained silicon layer in the thickness range between 5 nm and 20 nm.

A conductive channel forms at the surface of the strained silicon layer in the MOS transistor in the conductive condition both for n-channel as well as for, p-channel transistors. In order to avoid the formation of buried channels at the boundary surface between the $Si_{1-x}Ge_x$ layer and the strained silicon layer, it is within the scope of the invention to provide a buffer layer between the $Si_{1-x}Ge_x$ layer and the strained silicon layer. The buffer layer contains $Si_{1-y}Ge_y$ with y≦x and the germanium portion decreasing therein. The buffer layer exhibits the lowest germanium portion at the boundary surface of the strained silicon layer.

For realizing a symmetrical CMOS circuit in which the threshold voltage of n-channel transistors is the same as the threshold voltage of the p-channel transistors, it is advantageous to provide the MOS transistors with gate electrodes that contain p$^+$-doped germanium. The gate electrodes can be comprised of pure polycrystalline germanium or of a mixture of polycrystalline $Si_xGe_{1-x}$. Polycrystalline, p$^+$-doped germanium has work function that is approximately in the middle of the band gap of strained silicon. Both n as well as p-surface channel MOS transistors can thus be realized with excellent characteristics. It is especially advantageous to realize a complementary MOS transistor pair in a semiconductor island that comprises a p-channel transistor and an n-channel transistor as an inverter.

The manufacture of the semiconductor islands is preferably based on an SOI substrate that comprises a silicon layer and an insulating layer arranged therebelow on a carrier wafer. The silicon layer is structured like an island, whereby the surface of the insulating layer is partially uncovered. The $Si_{1-x}Ge_x$ can be formed both by selective epitaxy on the structured silicon layer as well as by introduction of germanium into the structured silicon layer by implantation or diffusion. Selective epitaxy is advantageous in view of a defined layer thickness.

The strained silicon layer is subsequently grown by selective epitaxy. For epitaxial growth, the lattice constant from the $Si_{1-x}Ge_x$ layer is transferred into the strained silicon layer.

For flat source/drain regions, it is advantageous to respectively form the source/drain region of a first sub-region and a second sub-region. The second sub-region thus exhibits a lesser depth and lower dopant concentration than the first sub-region. The effective channel length is determined by the lateral spacing of the second sub-regions. In the literature, the term HDD profile for the first sub-regions and the term LDD profile for the second sub-regions are standard.

It is advantageous to first produce the first sub-regions, whereby spacers at the sidewalls of the gate electrode define the spacing of the first sub-regions from the gate electrode edge. After removal of these spacers, the second sub-regions of the source/drain regions are formed. Since the second sub-regions are formed after the first sub-regions, they are not subjected to the temperature loads and to the process steps for forming the first sub-regions and they can therefore be manufactured with a steeper dopant profile.

The second sub-regions for the source/drain regions of the p-channel transistors are preferably formed by etching at least into the distorted silicon layer and subsequent selective epitaxy doped in situ. Given epitaxy doped in situ, the dopant is incorporated into the epitaxially grown crystal region. A subsequent activation of the dopant is not required given epitaxy doped in situ. Nearly step-shaped dopant profiles can thus be formed.

The invention is explained in greater detail below with reference to the exemplary embodiments that are shown in the Figures.

DESCRIPTION OF THE PREFERRED EMBODIMENTS

Figure 1:
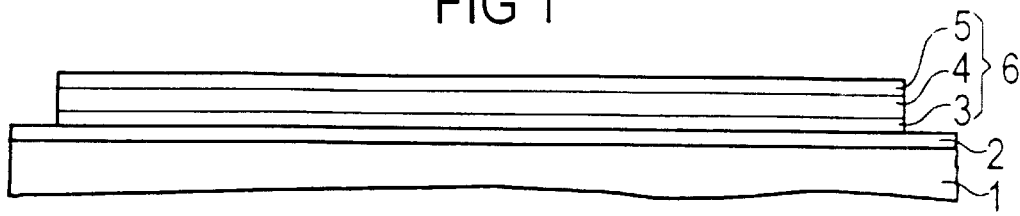
FIG. 1 illustrates a substrate with a semiconductor island.

An insulating layer 2 of, for example $SiO_2$ having a thickness of, for example, 400 nm is formed on a base 1 of, for example, silicon or sapphire. A structured silicon layer 3 having a thickness of, for example, 0 through 10 nm, an $Si_{1-x}Ge_x$ layer 4 with a layer thickness of, for example, 15 nm and a germanium content of, for example, 35 percent, and a strained silicon layer 5 with a layer thickness of, for example, 5 nm are formed on the insulating layer 2. The structured silicon layer 3, the $Si_{1-x}Ge_x$ layer 4 and the strained silicon layer 5 together form a semiconductor island 6 (see FIG. 1).

An SOI substrate is preferably employed for manufacturing the semiconductor island 6. The SOI substrate is comprised of the carrier plate 1 of silicon and the insulating layer 2 of $SiO_2$ and a monocrystalline silicon layer formed thereon. First, the monocrystalline layer is reduced to the desired thickness, for example by oxidation and etching with, for example, HF. Subsequently, the structured silicon layer 3 is formed with the assistance of photolithographic process steps. The $Si_{1-x}Ge_x$ layer 4 is grown by selective epitaxy with $H_2$, $SiH_2Cl_2$, $GeH_4$ as process gas in the temperature range between 500° C. and 900° C. and pressure range between 1 and 760 Torr. Mechanical stresses occurring in the $Si_{1-x}Ge_x$ layer relax into the structured silicon layer 3 via the uncovered side faces. The $Si_{1-x}Ge_x$ layer 4 formed in the selective epitaxy is almost free of mechanical stresses. The strained silicon layer 5 is also grown by selective epitaxy. $H_2$, $SiH_2Cl_2$ is employed as process gas. The process temperature is desirably between 600° C. and 800° C., and the pressure is between 1 and 760 Torr.

The semiconductor island 6 has dimensions of, for example, $2 \mu m \times 5 \mu m$ parallel to the surface of the insulating layer 2.

By changing the process gas composition during the selective epitaxy for manufacturing the $Si_{1-x}Ge_x$ layer, a buffer layer of $Si_{1-y}Ge_y$ in which the germanium percentage steadily decreases at the boundary surface to the strained silicon layer 5 can be achieved. For the sake of clarity, the buffer layer is not shown in FIG. 1. The buffer layer has a thickness of, for example, 10 nm. The germanium content y amounts, for example, to 35 percent through 0 percent.

Figure 2:
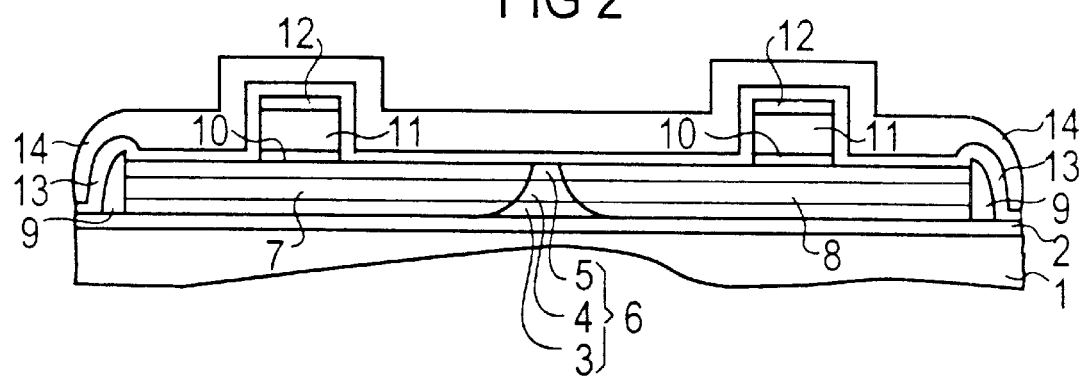
FIG. 2 illustrates the substrate after the formation of wells for the acceptance of complementary MOS transistors.

For manufacturing an n-channel transistor and a p-channel transistor in the semiconductor island 6, a scatter oxide layer of TEOS $SiO_2$ is first deposited to a thickness of 20 nm (not shown). A p-doped well 7 for the n-channel transistor and an n-doped well 8 for the p-channel transistor is formed by masked implantation (see FIG. 2). The implantation of the p-doped well 7 is performed, for example, with a dose of $2 \times 10^{12}$ cm$^{-2}$ at 7 keV. The implantation for forming the n-doped well 8 takes place, for example, with phosphorous having a dose of $3 \times 10^{12}$ cm$^{-2}$ at 15 keV.

The final, vertical island edges are subsequently photolithographically defined and anisotropically etched with, for example, $CHF_3/CF_4$ (scatter oxide) or, respectively, HBr (Si/SiGe stack). The insulating layer 2 is the etch stop. After potential passivation of the sidewalls of the semiconductor island, sidewall spacers 9 are formed of, for example, $Si_3N_4$ and the scatter oxide layer is removed (see FIG. 2).

For forming gate dielectric 10, gate electrode 11 and cover layer 12 for the n-channel transistor and the p-channel transistor, an $SiO_2$ layer that, in the exemplary embodiment, is 3 nm thick is deposited by plasma deposition or by thermal oxidation at 600° C. A polycrystalline gate electrode layer of, for example, polycrystalline germanium or polycrystalline $Si_{1-x}Ge_x$ with x equal to 0.15 is deposited, and a cover layer of $SiO_2$ having a thickness of, for example, 200 nm is deposited and subsequently structured with the assistance of photolithographic process steps and anisotropic etching with, for example, HBr. Alternatively, the gate electrode 11 can be formed with electron beam lithography or with spacer techniques. The gate length may be, for example, to 100 nm.

A first auxiliary layer 13 of, for example, TEOS $SiO_2$ or $Si_3N_4$ is deposited surface-wide in a layer thickness of, for example, 10 nm with essentially conformal edge coverage. A second auxiliary layer 14 of, for example, polysilicon having a layer thickness of, for example, 60 nm is deposited thereon. The second auxiliary layer 14 can be selectively etched relative to the first auxiliary layer.

Figure 3:
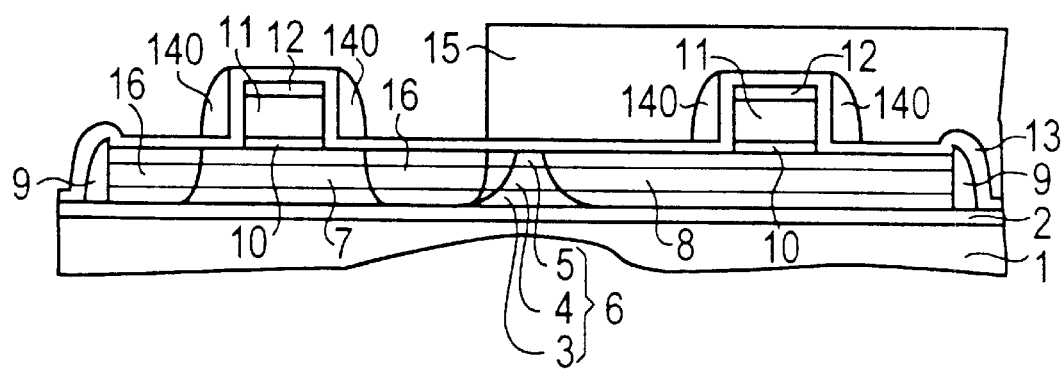
FIG. 3 illustrates the substrate after formation of spacers from the second auxiliary layer.

Spacers 140 (see FIG. 3) are formed in the region of the sidewalls of the gate electrodes 11 by anisotropic etching of the second auxiliary layer 14 selectively relative to the first auxiliary layer 13 with, for example, HBr. A first mask 15 of, for example, photoresist is formed that covers the n-doped well 8. An implantation with arsenic with a dose of $2\times10^{15}$ cm$^{-2}$ at an energy of 30 keV is implemented for forming first sub-regions 16 of the source/drain regions for the n-channel transistor. The first mask 15 is subsequently removed and a tempering step is implemented for annealing implantation damage and for the drive-in and activation of the dopant in the first sub-regions 16 of the n-channel transistor. The tempering step is implemented, for example, for 60 seconds at 800° C.

Figure 4:
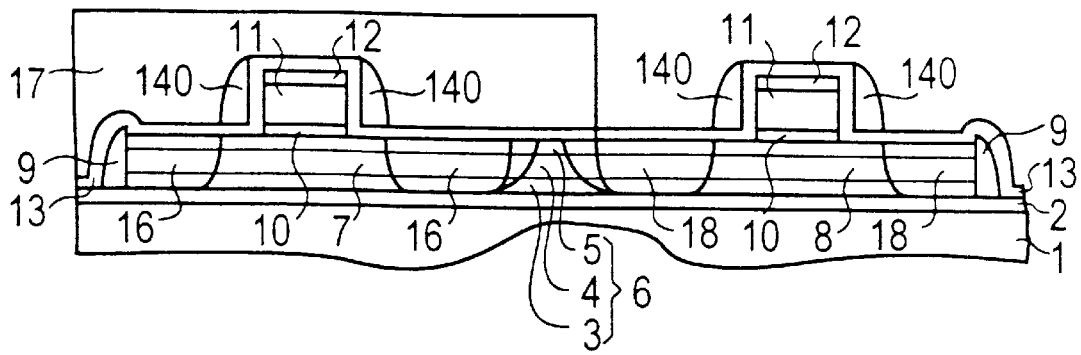
FIG. 4 illustrates the substrate after formation of first sub-regions for the source/drain regions of the p-channel transistors.

A second mask 17 is produced that covers the p-doped well 7. First sub-regions 18 of the source/drain regions for the p-channel transistor are formed by implantation with boron at $2\times10^{15}$ cm$^{-2}$ and 10 keV (see FIG. 4). By employing a somewhat higher energy in the implantation for forming the first sub-regions 16 for the n-channel transistor and the first sub-regions 18 for the p-channel transistor, mechanical stresses that arise can better relax since the insulating layer 2 is softened given higher energy and dose of the implantation and it is easier for the semiconductor island 6 to slide in order to relax mechanical stresses.

Figure 5:
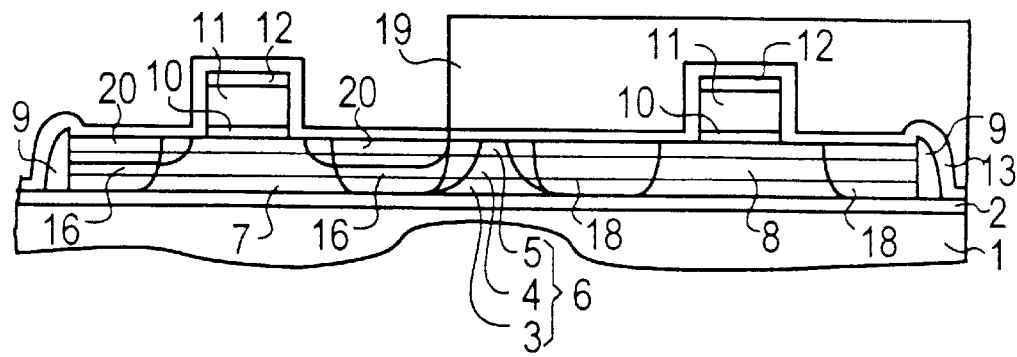
FIG. 5 illustrates the substrate after removal of the spacers and formation of second sub-regions.

The second mask 17 is removed. The spacers 140 are selectively removed relative to the first auxiliary layer 13 by wet-chemical etching with, for example, choline (see FIG. 5).

A third mask 19 of, for example, photoresist is formed, which covers the n-doped well 8. Second sub-regions 20 of the source/drain regions for the n-channel transistor are formed by implantation with arsenic at $2\times10^{14}$ cm$^{-2}$ (see FIG. 5). The depth and the dopant concentration of the second sub-regions 20 of the source/drain regions are lower than for the first sub-regions 16. The lateral dimension of the second sub-regions 20, however, is larger than that of the first sub-regions 16 since the spacers 140 were previously removed.

After removal of the third mask 19, a common tempering step is implemented in order to anneal implantation damage in the formation of the first sub-regions 18 for the p-channel transistor and of the second sub-regions 20 for the n-channel transistor and in order to drive the dopant into these regions and activate it. The tempering step takes place, for example, for 30 seconds at 750° C. Under these conditions, the dopant profile is prevented from coming apart, particularly in the second sub-region 20 for the n-channel transistor.

Figure 6:
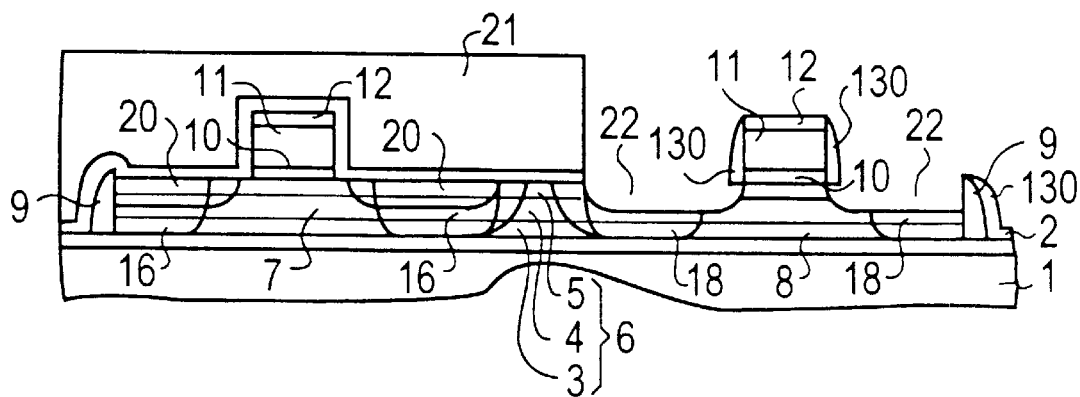
FIG. 6 illustrates the substrate after an etching into the semiconductor island in the region of the p-channel transistor.

A fourth mask 21 of, for example, photoresist is formed, which covers the p-doped well 7. The first auxiliary layer 13 is etched in the region for the p-channel transistor by anisotropic etching with, for example, an anisotropic CHF$_3$ and CF$_4$ etching process, whereby spacers 130 at the sidewalls of the gate electrode 11 arise from the first auxiliary layer 13 (see FIG. 6).

Depressions 22 are formed in the region for the p-channel transistor to the side of the gate electrode 6 by an etching that attacks silicon selectively relative to the spacers 130. The etching preferably ensues isotropically, so that the depressions also extend under the spacers 130. The depressions 22 exhibit a depth of, for example, 15 nm. They extend into the Si$_{1-x}$Ge$_x$ layer 4. It is advantageous in the etching of the depressions 22 to employ a germanium signal from the Si$_{1-x}$Ge$_x$ layer 4 as a stop signal. The etching is done, for example, wet-chemically with choline.

After removal of the fourth mask 21 and a wet cleaning of the crystalline surfaces uncovered in the region of the depressions 22, for example with an HF dip, the depressions 22 are filled with second sub-regions 23 of the source/drain regions for the p-channel transistor by selective, epitaxial deposition doped in situ. It is thereby advantageous to implement a low-temperature cleaning of the surfaces in situ at 750° C. by slight addition of GeH$_4$ or SiH$_4$, whereby the natural oxide is etched off of Si surfaces.

Figure 7:
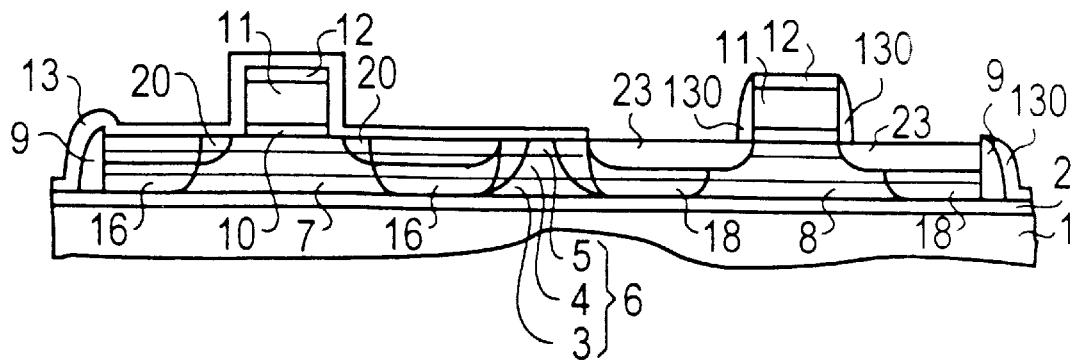
FIG. 7 illustrates the substrate after formation of second sub-regions of the source/drain regions for the p-channel transistor by selective, in-situ-doped epitaxy.
Figure 8:
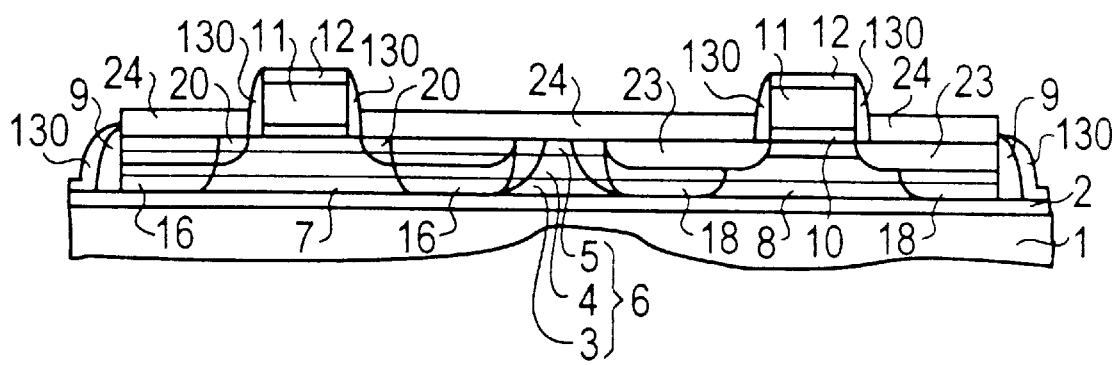
FIG. 8 illustrates the substrate after selective growth of silicon.
Figure 9:
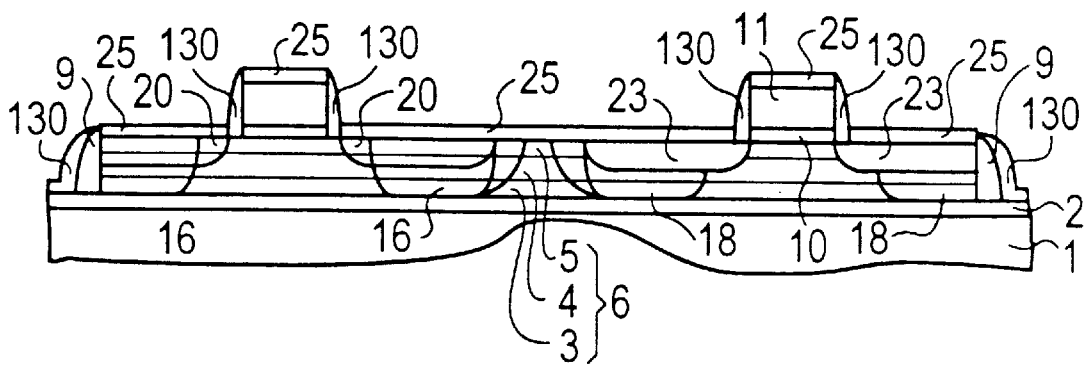
FIG. 9 illustrates the substrate after formation of silicide layers at the surface of the source/drain regions and of the gate electrodes.

The in-situ-doped, selective epitaxial silicon deposition takes place, for example, with a gas mixture of H$_2$, SiH$_2$Cl$_2$, HCl and B$_2$H$_6$ at 750° C. and 10 Torr. The process temperature is thereby selected such that the structure and cpmposition of the structured silicon layer 3, of the Si$_{1-x}$Ge$_x$ layer 4 and of the strained silicon layer remain unmodified. A step-shaped dopant profile for the second sub-regions 23 is generated. in a good approximation by the addition of B$_2$H$_6$ to the process gas mixture. The dopant is incorporated into the crystal lattice in the second sub-regions 23 by the in-situ-doped epitaxy, so that no tempering step is required for activation of the dopants. The step-shaped doping profile produced in the selective epitaxy therefore defines the expanse of the second sub-regions 23 for the p-channel transistor. The second sub-regions 23 for the p-channel transistor have a depth of, for example, 15 nm (see FIG. 7).

Subsequently, a spacer etching with, for example, an anisotropic CHF$_3$ and CF$_4$ etching process is also implemented in the region of the n-channel transistor, whereby the first auxiliary layer 13 is etched and spacers 130 arise at the sidewalls of the gate electrode 6. During the spacer etching in the region of the n-channel transistor, the region of the p-channel transistor can be covered with a further mask, which is not shown.

Subsequently, uncovered silicon surfaces are provided with a Si$_{1-z}$Ge$_z$ layer 24. The Si$_{1-z}$Ge$_z$ layer 24 is grown undoped. To that end, wet-cleaning with, for example, an HF dip and a low-temperature cleaning at, for example, 750° C. are first implemented. The subsequent epitaxial deposition of Si$_{1-z}$Ge$_z$ takes place, for example, at 650° C. and 10 Torr with a gas mixture that contains H$_2$, SiH$_2$Cl, HCl and GeH$_4$. The crystal composition is thereby selected such that the lattice constant of the Si$_{1-z}$Ge$_z$ layer 24 is essentially the same as the lattice constant of the Si$_{1-x}$Ge$_x$ layer 4, so that no further stress is built up.

Silicide terminals are formed after removal of the cover layer 12 from the gate electrodes 11. To that end, for example, a titanium layer is deposited and a tempering step is implemented for the formation of the titanium silicide terminals 25. The Si$_{1-z}$Ge$_z$ layer 24 is completely consumed, so that unwanted pn-junctions do not arise anywhere. The titanium silicide terminals 24 arise both at the surface of the first sub-regions 16, 18 and second sub-regions 20, 23 as well as on the surface of the gate electrodes 11 and on the exposed semiconductor surface between the neighboring n-channel and p-channel transistors. As a result, a source/drain region of the p-channel transistor is connected to one of the n-channel transistor. A self-aligned inverter is manufactured in this way.

Given short channel lengths below 150 nm, it is within the scope of the invention to manufacture the gate electrodes 11 with a T-shaped cross-section in order to improve the terminal impedance of the gate electrodes 11. In this example, the sidewall spacers 9 of Si$_3$N$_4$ prevent the formation of parasitic MOS transistors along the sidewalls of the semiconductor island 6. The sidewall spacers 9 can be alternatively formed of SiO$_2$. In order to prevent the corners of the semiconductor island 6 from being etched free during the structuring of the gate dielectric 10, it is within the scope of the invention in this case to manufacture the gate electrode 11 of at least two layers that are successively deposited and structured, and whereby a further $SiO_2$ spacer is formed between the two layers.

In the exemplary embodiment, a p-channel transistor and an n-channel transistor that are interconnected as an inverter are formed in the semiconductor island. Of course, the invention can also be applied to semiconductor islands in which only one transistor type, for example n,-channel or p-channel transistors, or only a single transistor is provided.

Since the semiconductor islands 6 are formed at the surface of the insulating layer and the capacitance of the first sub-regions 16, 18 and second sub-regions 20, 23 of the source/drain regions to the carrier plate 1 is inversely proportional to the thickness of the insulating layer 2. This capacitance can be set by the thickness of the insulating layer 2. When the insulating layer 2 exhibits a thickness of, for example, 400 nm, then these capacitances are comparable to those in an MOS transistor in semiinsulating GaAs. In the inventive CMOS circuit arrangement, thus, capacitances comparable to Si-MOS transistors with III–V semiconductor circuits, low-field mobilities that are just about as good but, compared to Ga As, better saturation drift speeds given high fields are achieved. Given channel lengths below 100 nm, however, the saturation properties should have a greater influence on the switching times than the low-field mobilities.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. An integrated and symmetrical CMOS circuit comprising:
   a plurality of semiconductor islands formed above an insulating layer, the plurality of semiconductor islands respectively comprising at least a $Si_{1-x}Ge_x$ layer, a strained, non-distorted silicon layer that exhibits substantially a same lattice constant as the $Si_{1-x}Ge_x$ layer, and at least one MOS transistor wherein the gate electrodes of the MOS transistors contain polycrystalline germanium such that n-channel transistors and p-channel transistors have substantially the same threshold voltages.

2. The CMOS circuit of claim 1, wherein a p-channel MOS transistor is provided in at least one semiconductor island and an n-channel MOS transistor is provided in at least one semiconductor island.

3. A CMOS circuit according to claim 1, wherein a silicon layer is formed between the $Si_{1-x}Ge_x$ layer and the insulating layer.

4. A CMOS circuit according to claim 3, wherein the structured silicon layer has a thickness of less than 20 nm; and
   the $Si_{1-x}Ge_x$ layer has a thickness of from 10 nm to 50 nm and a germanium composition of between 20 percent and 50 percent; and
   wherein the strained silicon layer has a thickness of between 5 nm and 20 nm.

5. A CMOS circuit according to claim 4, wherein a buffer layer that contains $Si_{y-1}Ge_y$ and in which the germanium content decreases is formed between the $Si_{1-x}Ge_x$ layer and the strained silicon layer.

6. A CMOS circuit according to claim 1, wherein at least one p-channel transistor and one n-channel transistor are formed in at least one semiconductor island.

* * * * *